United States Patent
Onishi et al.

(10) Patent No.: US 7,166,907 B2
(45) Date of Patent: Jan. 23, 2007

(54) IMAGE SENSOR MODULE WITH SUBSTRATE AND FRAME AND METHOD OF MAKING THE SAME

(75) Inventors: Hiroaki Onishi, Kyoto (JP); Hisayoshi Fujimoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/439,268

(22) Filed: May 13, 2003

(65) Prior Publication Data

US 2004/0094825 A1   May 20, 2004

(30) Foreign Application Priority Data

May 23, 2002   (JP)   ............... 2002-149335

(51) Int. Cl.
*H01L 23/02* (2006.01)
(52) U.S. Cl. ...................... 257/680; 257/434
(58) Field of Classification Search ........ 257/678–684, 257/99–100, 434–436; 438/48, 64
See application file for complete search history.

(56) References Cited

U.S. PATENT DOCUMENTS

| | | | | |
|---|---|---|---|---|
| 5,920,119 A | * | 7/1999 | Tamba et al. | 257/718 |
| 6,011,294 A | * | 1/2000 | Wetzel | 257/434 |
| 6,121,675 A | * | 9/2000 | Fukamura et al. | 257/680 |
| 6,483,030 B1 | * | 11/2002 | Glenn et al. | 174/52.4 |
| 6,528,869 B1 | * | 3/2003 | Glenn et al. | 257/678 |
| 6,531,766 B1 | * | 3/2003 | Taniguchi et al. | 257/678 |
| 6,603,182 B1 | * | 8/2003 | Low et al. | 257/432 |
| 6,627,872 B1 | * | 9/2003 | Fukamura et al. | 250/239 |
| 6,740,950 B1 | * | 5/2004 | Paek | 257/433 |
| 6,812,555 B1 | * | 11/2004 | Chen | 257/679 |
| 6,900,986 B1 | * | 5/2005 | Kimoto et al. | 361/704 |
| 2003/0042585 A1 | * | 3/2003 | Corisis et al. | 257/668 |
| 2004/0089955 A1 | * | 5/2004 | Zhou | 257/787 |

FOREIGN PATENT DOCUMENTS

JP   10-41492   2/1998

* cited by examiner

*Primary Examiner*—Nathan W. Ha
(74) *Attorney, Agent, or Firm*—Hamre, Schumann, Mueller & Larson, P.C.

(57) ABSTRACT

An image sensor module (S) includes a substrate (4) having a projecting portion (41) projecting sideways from a frame (3). The projecting portion (41) has an end (4b) provided with a plurality of terminals (81) electrically connected to an image sensor chip (5). The image sensor module (X) can be easily connected to another apparatus by inserting the end (4b) of the projecting portion (41) into a socket type connector.

7 Claims, 6 Drawing Sheets

IMAGE SENSOR MODULE WITH SUBSTRATE AND FRAME AND METHOD OF MAKING THE SAME

BACKGROUND OF THE INVENTION

1. Field of the Invention

The present invention relates to an image sensor module for use as a structural part of a digital camera or a camera-equipped cell phone and also relates to a method of making the same.

2. Description of the Related Art

Figure 5:
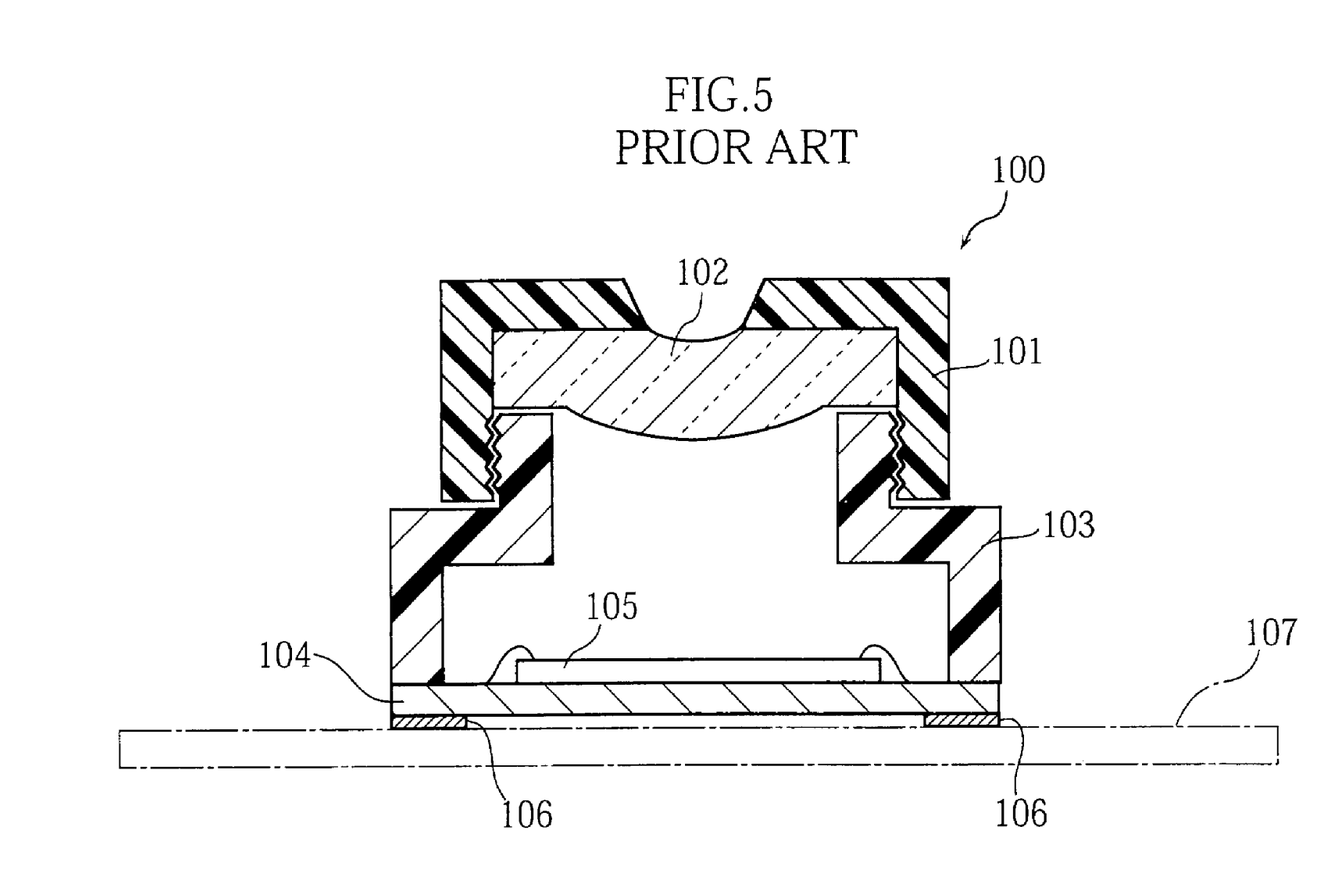
FIG. 5 is a sectional view illustrating an example of prior art structure.

FIG. 5 illustrates an example of prior art image sensor module. The illustrated image sensor module 100 comprises a substrate 104 having an obverse surface on which an image sensor chip 105 is mounted and a frame 103 is attached. A lens holder 101 holding a lens 102 is mounted to the frame 103. With this structure, light traveling from an object passes through the lens 102 to form an image of the object on the image sensor chip 105. The substrate 104 has a reverse surface provided with a plurality of terminals 106 electrically connected to the image sensor chip 105. The image sensor module 100 is mounted on a mother board 107 in a cell phone for constituting the camera-equipped cell phone, for example.

The image sensor module 100 is mounted to the mother board 107 as follows. First, before mounting the lens holder 101 to the frame 103, the substrate 104 is mounted to the mother board 107 by reflow soldering. Then, the lens holder 101 is mounted to the frame 103. In this way, the mounting is performed through two steps, because if reflow soldering is performed with the lens holder 101 mounted to the frame 103, the lens 102 may be damaged by heat.

However, the mounting of the image sensor module 100 through such two steps is troublesome. Particularly, in the case where a cell phone manufacturer installs the image sensor module 100 in a cell phone, the manufacturer also needs to attach the lens holder 101 to the frame 103 after mounting the substrate 104. Thus, the maker has to substantially perform assembling of the image sensor module, which is great burden on the manufacturer.

Figure 6:
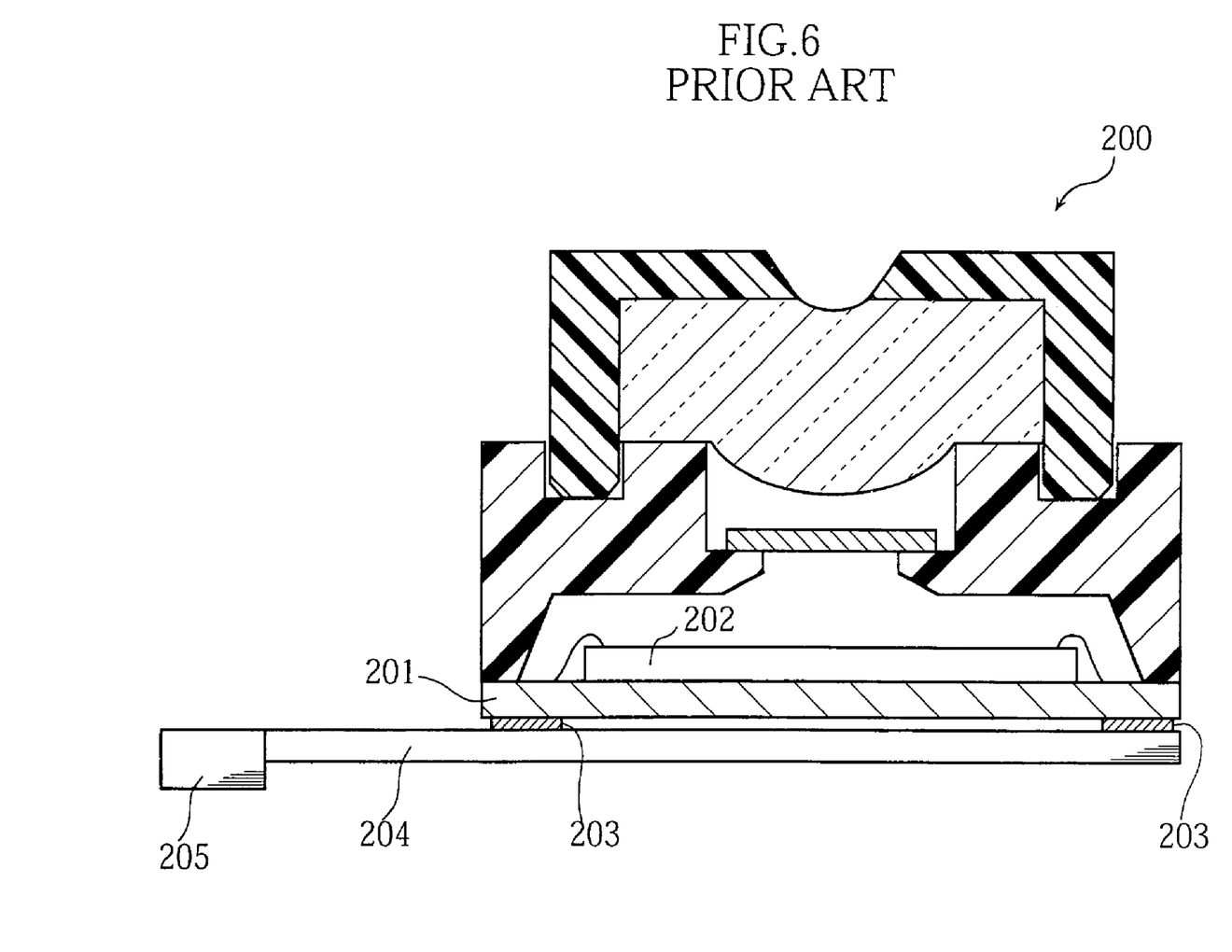
FIG. 6 is a sectional view illustrating another example of prior art structure.

Another example of prior art image sensor module is shown in FIG. 6. In the illustrated image sensor module 200, a substrate 201 on which an image sensor chip 202 is mounted has a reverse surface to which a connection cable 204 electrically connected to a plurality of terminals 203 is connected. The connection cable 204 has a tip end connected to a plug 205 which can be inserted into a socket type connector. With such a structure, in the case where a cell phone manufacturer installs the image sensor module 200 in a cell phone, the manufacture needs only to insert the plug 205 of the connection cable 204 into a socket type connector, and the work is very easy.

However, in the prior art structure, it is necessary to prepare the connection cable provided with the plug 205 and to connect the connection cable 204 to the substrate 201. Therefore, the number of parts and the number of process steps for making an image sensor module are increased, which leads to an increase in the manufacturing cost.

SUMMARY OF THE INVENTION

It is, therefore, an object of the present invention to provide an image sensor module capable of eliminating or lessening the above-described problems.

Another object of the present invention is to provide a method capable of properly making such an image sensor module. According to a first aspect of the present invention, there is provided an image sensor module comprising a substrate on which an image sensor chip for photoelectric conversion is mounted, and a frame mounted to the substrate to surround the image sensor chip. The substrate includes a projecting portion projecting sideways from the frame, and the projecting portion has an end provided with a plurality of terminals electrically connected to the image sensor chip.

Preferably, the plurality of terminals are aligned along an edge of the end at a predetermined pitch.

Preferably, the end of the projecting portion is smaller in thickness than other portions of the substrate.

Preferably, one of an obverse and a reverse surfaces of the substrate, on which the image sensor chip is mounted, is formed with a wiring pattern including the plurality of terminals, and the other one of the surfaces which is opposite to said surface is stepped for making the end of the projecting portion smaller in thickness than other portions of the substrate.

Preferably, the frame supports a lens for forming an image of an object on the image sensor chip.

Preferably, the image sensor module according to the present invention further comprises an optical filter for blocking light of a predetermined wavelength range of the light traveling toward the image sensor chip.

According to a second aspect of the present invention, there is provided a method of making an image sensor module comprising the steps of mounting a plurality of image sensor chips on an aggregate board formed with plural sets of terminals, mounting a plurality of frames on the aggregate board so that each frame surrounds a respective one of the image sensor chips while avoiding the terminals and dividing the aggregate board into a plurality of substrates so that each frame and the relevant set of terminals are located on a same substrate.

Preferably, the method of making an image sensor module according to the present invention further comprises the step of mounting an image forming lens to each of the frames after the step of mounting the plurality of frames on the aggregate board and before or after the step of dividing the aggregate board into the plurality of substrates.

Other objects, features and advantages of the present invention will become clearer from the description of the preferred embodiment given below.

DETAILED DESCRIPTION OF THE PREFERRED EMBODIMENTS

Preferred embodiments of the present invention will be described below in detail with reference to the accompanying drawings.

Figure 1:
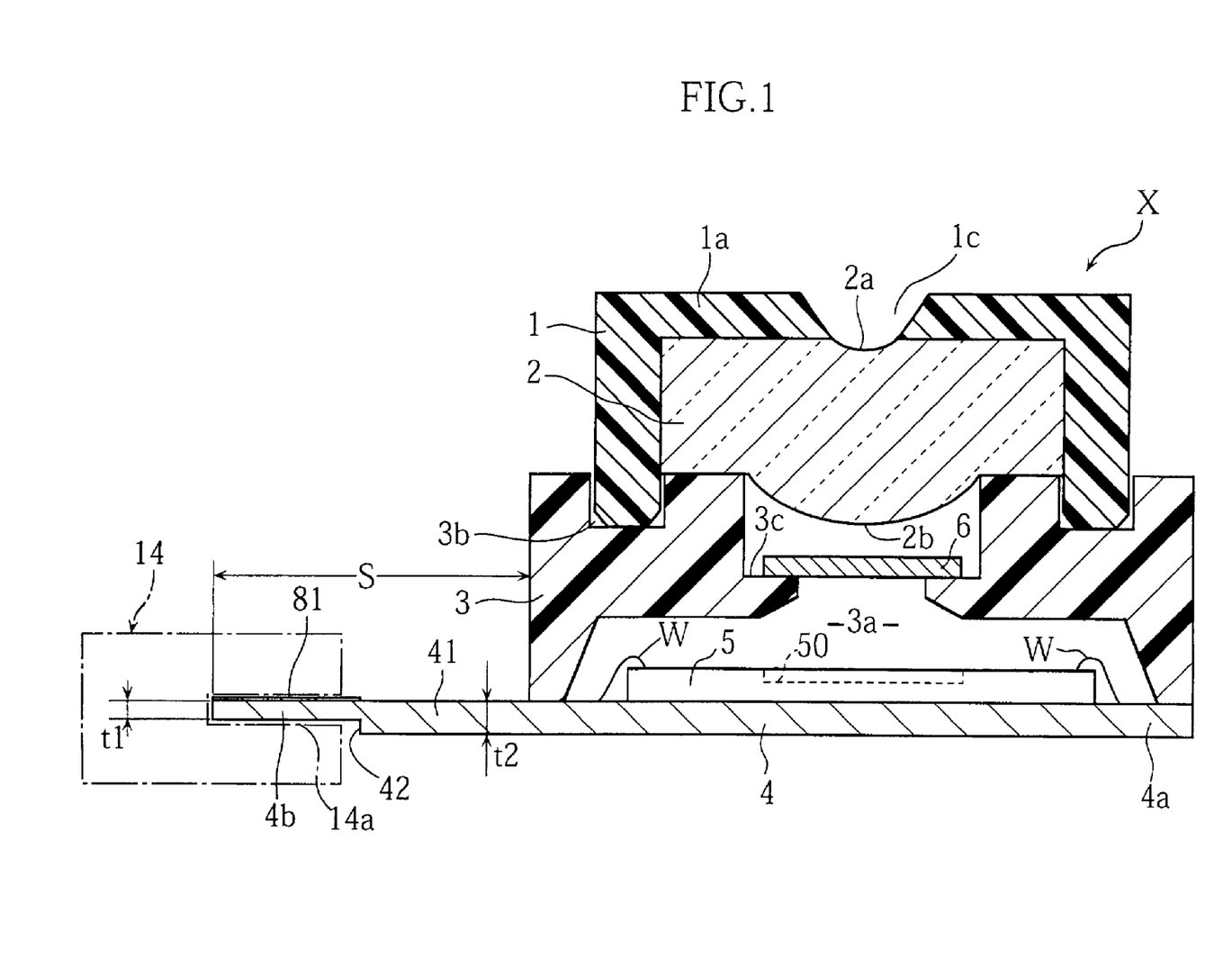
FIG. 1 is a sectional view illustrating an example of image sensor module according to the present invention.

FIG. 1 illustrates an example of image sensor module according to the present invention. The image sensor module X in this embodiment comprises a substrate 4, an image sensor chip 5, a frame 3, and a lens holder 1 holding a lens 2.

Figure 2:
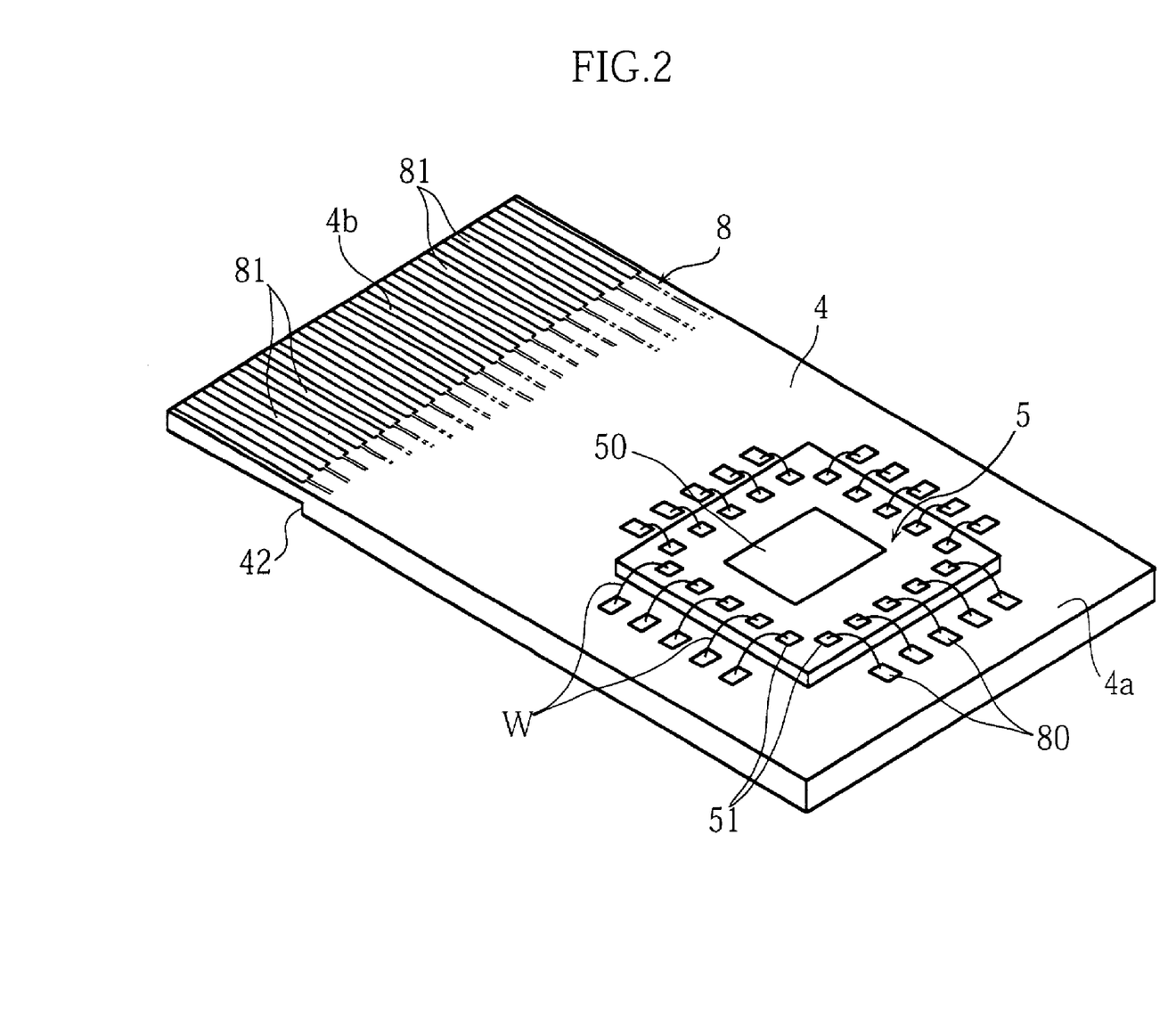
FIG. 2 is a perspective view illustrating the substrate of the image sensor module shown in FIG. 1.

The substrate 4, which may be made of glass-fiber-reinforced epoxy resin for example, has an elongated rectangular configuration. The substrate 4 has an obverse surface (upper surface) on which the image sensor chip 5 is mounted at a location offset from the middle portion of the substrate 4 toward one end 4a in the longitudinal direction. As shown in FIG. 2, the image sensor chip 5, which may be a CCD or MOS solid-state image pickup device for example, has an upper surface provided with a light receiving portion 50 and a plurality of electrodes 51. The light receiving portion 50 includes a plurality of non-illustrated light receiving surfaces as dots arranged in a matrix. When each of the light receiving surfaces receives light, signals (image signals) of an output level corresponding to the received amount of light are emitted from the plurality of electrodes 51. In addition to such electrodes for outputting image signals, the electrodes 51 includes electrodes for inputting and outputting various signals required for driving the image sensor chip 5 and electrodes for power supply.

The obverse surface of the substrate 4 is formed with a wiring pattern 8 formed of a film of metal such as copper. (The illustration of the conductor wiring pattern 8 is partially omitted.) The wiring pattern 8 includes a plurality of wire bonding pads 80 arranged to surround the image sensor chip 5, and a plurality of terminals 81 provided at an end 4b in the longitudinal direction of the substrate 4. Each of the pads 80 is electrically connected to a corresponding one of the terminals 81. The pads 80 are connected to the electrodes 51 of the image sensor chip 5 via wires W. Accordingly, the terminals 81 are electrically connected to the electrodes 51 so that power supply and inputting or outputting of various signals from the terminals 81 to the image sensor chip 5 can be performed. The terminals 81, each comprising a thin strip extending longitudinally of the substrate 4, are arranged along the edge of the end 4b of the substrate 4 (widthwise of the substrate 4) at a predetermined pitch. The obverse surface of the substrate 4 is formed with an insulating film (not shown) formed of a resin for example, which covers the obverse surface except for the portions formed with the terminals 81 and the pads 80 of the wiring pattern 8 for insulation protection.

Referring to FIG. 1, the frame 3, which is made of a light-shielding synthetic resin, is fixedly mounted to the obverse surface of the substrate 4. The mounting may be performed using an adhesive, for example. The lower portion of the frame 3 is a prismatic or cylindrical tube surrounding the image sensor chip 5. In the frame 3, a light path 3a is defined for passing the light which has entered from the outside through the lens 2. Similarly to the image sensor chip 5, the frame 3 is arranged at a location offset from the middle portion of the substrate 4 toward the end 4a in the longitudinal direction. Therefore, the substrate 4 includes a projecting portion 41 having a dimension S projecting sideways from the frame 3 at or adjacent to the opposite end 4b. Thus, the terminals 81 formed on the obverse surface of the end 4b are exposed to the outside of the frame 3. (Only the terminals 81 are schematically illustrated in FIG. 1. of the parts of the wiring pattern 8.) The substrate 4 has a reverse surface formed with a stepped portion 42, so that the portion of the substrate formed with the terminals 81 has a thickness t1 which is smaller than a thickness t2 of other portions of the substrate 4.

The lens holder 1 is formed of a light-shielding synthetic resin similarly to the frame 3 and is in the form of a downwardly open case. The lens 2, which is made of a transparent synthetic resin or glass, is a convex lens having an upper surface including a concavely curved surface 2a provided at the center portion thereof and a lower surface including a convexly curved surface 2b provided at the center portion thereof. Light from an object is converged by the lens 2 to form an image of the object on the light receiving portion 50 of the image sensor chip 5. The lens holder 1 is bonded to the frame 3 with the lower end thereof fitted in a groove 3b formed at an upper surface of the frame 3. As the bonding means, use may be made of an adhesive, for example. The lens holder 1 has an upper wall 1a formed with an opening 1c for allowing external light to impinge only on the concavely curved surface 2a of the upper surface of the lens 2, thereby serving as a diaphragm.

Directly below the lens 2, an optical filter 6 is disposed. The optical filter 6 may be, for example, an infrared cut filter for blocking infrared rays contained in the light passing through the lens 2 to provide a clear captured image. The optical filter 6 is supported on a stepped portion 3c provided in the frame 3.

Next, an example of method for making the image sensor module X will be described.

Figure 3A:
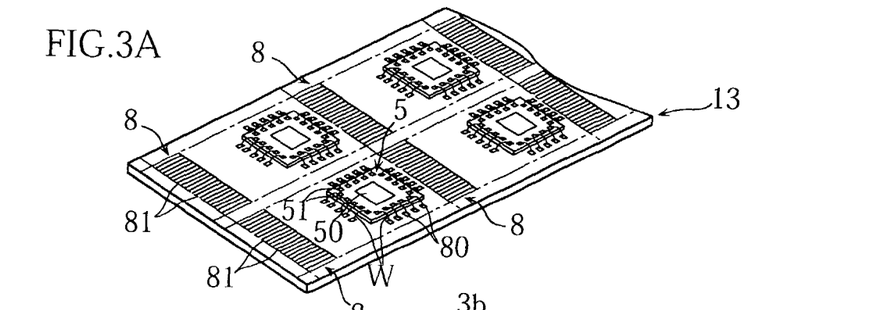
FIGS. 3A–3D illustrate an example of method of making an image sensor module.

Firstly, an aggregate board 13 as shown in FIG. 3A is prepared, and a plurality of image sensor chips 5 are mounted on the aggregate board 13. The aggregate board 13 has an obverse surface formed with a plurality of wiring patterns 8 arranged in rows and columns so as not to interfere with each other. Each of the wiring patterns includes a plurality of terminals 81 and a plurality of pads 80. Though not illustrated in the figure, etching for example is performed with respect to the reverse surface of the aggregate board 13 at a portion opposite to the portion formed with the terminals 81 to reduce the thickness of the substrate at that portion. This portion becomes a thin-walled end 4b in the projecting portion 41 of the image sensor module X. In mounting each image sensor chip 5, a wire W is bonded to each of the electrodes 51 and a relevant pad 80 to electrically connect the electrode to the pad.

Figure 3B:
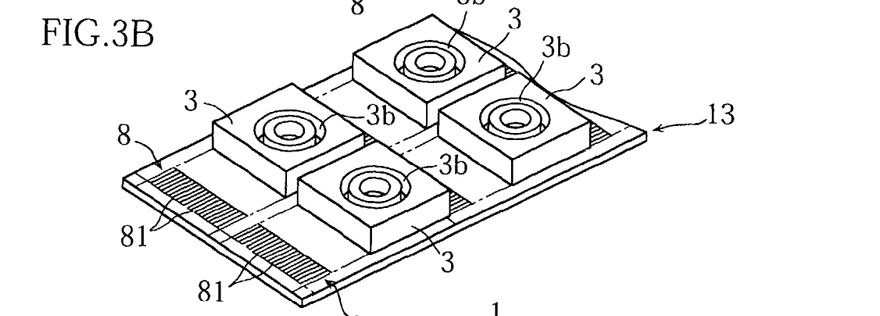

Subsequently, as shown in FIG. 3B, a plurality of frames 3 are mounted on the aggregate board 13. Specifically, the frames 3 are so mounted as to cover each image sensor chip 5 and the relevant pads 80 but not to cover the terminals 81. An optical filter 6 is attached to each of the frames 3 in advance.

Figure 3C:
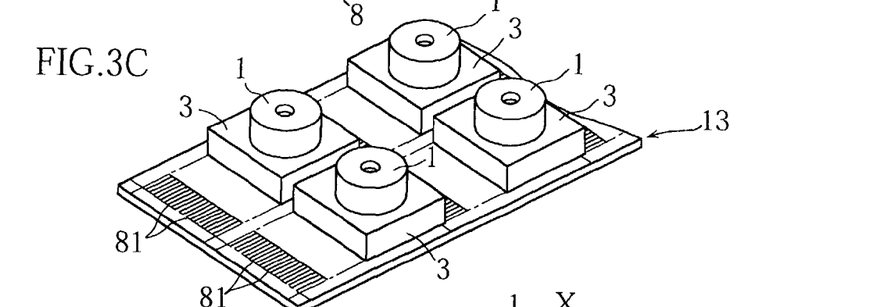

Thereafter, as shown in FIG. 3C, a lens holder 1 is mounted to each of the frames 3 to mount the lens 2. In mounting the lens holder 1, the lower portion of the lens holder 1 is fitted into a groove 3b formed in the frame 3, and then the fitted portions are bonded together. As described before, the bonding may be performed using an adhesive, for example.

Figure 3D:
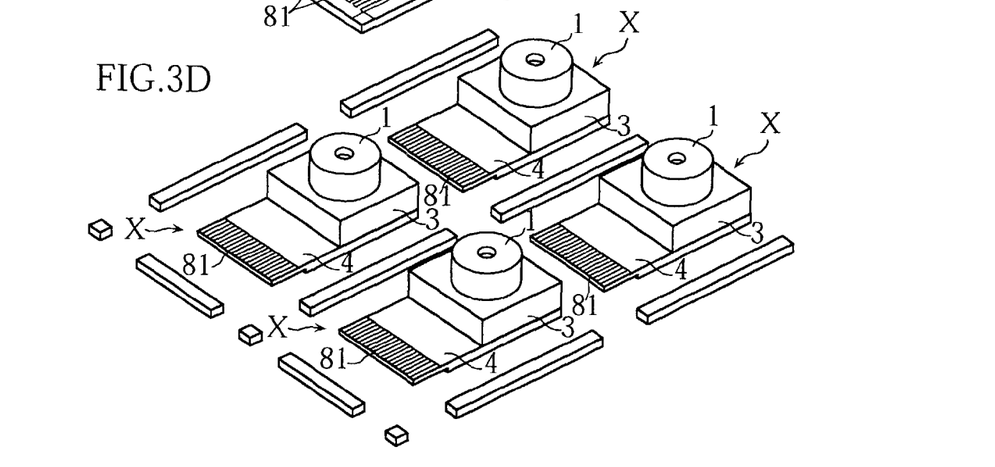

Subsequently, as shown in FIG. 3D, the aggregate board 13 is cut into a plurality of substrates 4. The cutting is so performed that each frame 3 and the relevant terminals 81 are located on the same substrate 4. Through the series of process steps described above, image sensor modules X are provided.

Next, the advantages of the image sensor module X will be described.

Firstly, the projecting portion 41 of the substrate 4 is provided with the terminals 81 aligned at the end 4b, and this structure is similar to that of a plug-type connector. Therefore, when the end 4b of the projecting portion 41 is inserted into a recess 14a of a socket-type connector 14 prepared in advance as indicated by phantom lines in FIG. 1, the substrate 4 can be mechanically and electrically connected to the connector 14. Specifically, by the fitting of the end 4b of the projecting portion 41 to the connector 14, the substrate 4 can be connected to the connector 14 for mounting. Further, the recess 14a of the connector 14 is formed with a plurality of terminals (not shown) corresponding to the terminals 81. By bringing these terminals into contact with each other, electrical connection can also be provided. Thus, power supply or inputting and outputting of various signals to the image sensor chip 5 can be performed easily via the connector 14.

In this way, the image sensor module X can be mounted just by inserting part of the substrate 4 into the connector 14. Therefore, unlike the prior art structure shown in FIG. 5, reflow soldering as mounting means is not necessary. In the case where reflow soldering is utilized for mounting, the lens 2 need be detached from the frame 3 in advance. The image sensor module X can eliminate such a need.

Moreover, unlike the prior art structure shown in FIG. 6, a connection cable provided with a plug need not be attached to the substrate 4 of the image sensor module X. Therefore, the number of parts and the number of process steps can be reduced, which leads to reduction of the manufacturing cost.

Although the thickness t1 at the end 4b of the substrate 4 is made relatively small so as to correspond to the recess 14a of the connector 14, the thickness t2 at other portions of the substrate is sufficiently large. Therefore the substrate 4 has a sufficient mechanical strength and is unlikely to be warped or deformed. Since the thickness t1 at the end 4b is made small by forming the stepped portion 42 at the reverse surface of the substrate 4, the provision of the smaller thickness portion does not hinder the forming of the wiring pattern 8 on the obverse surface of the substrate 4, for example.

The present invention is not limited to the above-described embodiments, and specific structure of each part of the image sensor module according to the present invention may be modified in various ways. Similarly, specific structure in each step of the manufacturing method of an image sensor module according to the present invention may be modified in various ways.

For example, in the present invention, a plurality of terminals maybe so provided as to extend from the obverse surface up to a side surface of the substrate or to extend from the obverse surface up to the reverse surface (lower surface) beyond a side surface of the substrate instead of forming the terminals only on the obverse surface (upper surface) of the substrate. Further, although it is preferable that the plurality of terminals are collectively provided at one end of the substrate, the invention is not limited thereto. Alternatively, the terminals may be divisionally provided at a plurality of ends. The projecting length, width or the like of the projecting portion of the substrate may be appropriately varied in accordance with the shape of a connector to be connected.

Figure 4:
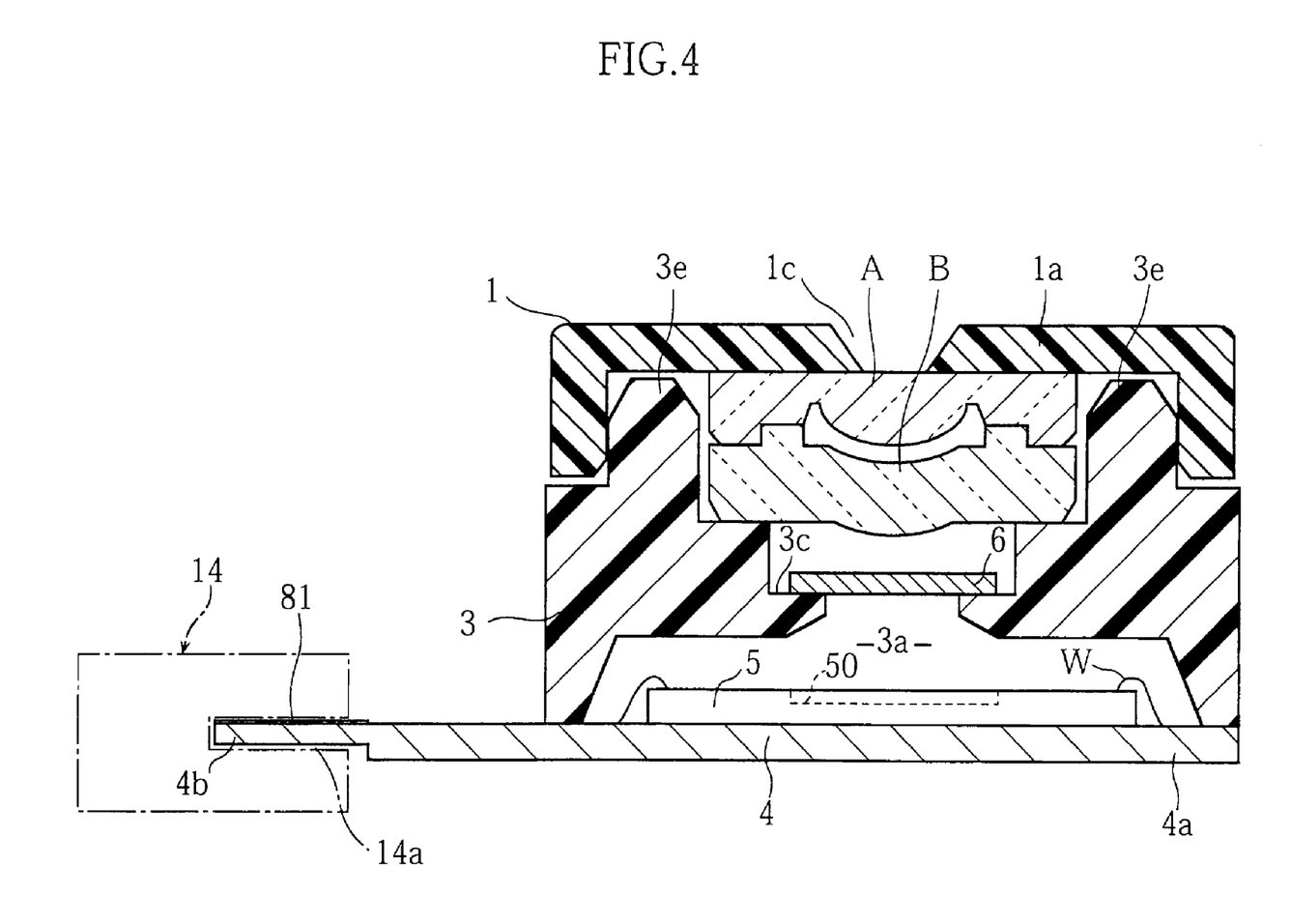
FIG. 4 is a sectional view illustrating another example of image sensor module according to the present invention.

FIG. 4 illustrates another example of image sensor module according to the present invention. In the figure, the elements which are identical or similar to those of the above-described embodiment are designated by the same reference signs as those used in the above-described embodiment.

The image sensor module shown in the figure includes two lenses A and B. As compared with the case where a single lens is used, the use of a plurality of lenses can lessen the aberration and increase the number of apertures. Therefore, it is possible to prevent the distortion of a captured image and to provide a clear captured image. Further, the image sensor module has a frame 3' formed with an annular projection 3e which is fitted in a lens holder 1. The present invention can also utilize such a structure as means for attaching the frame to the lens holder.

The invention claimed is:

1. An image sensor module comprising:
    a substrate including a chip-mounting surface and a reverse surface opposite to the chip-mounting surface, the chip-mounting surface supporting an image sensor chip for photoelectric conversion, the substrate being a single-layer member made of a single kind of material as a whole; and
    a frame mounted on the chip-mounting surface of the substrate to surround the image sensor chip;
    the substrate including a connector portion projecting sideways from the frame;
    the connector portion having an end provided with a plurality of terminals electrically connected to the image sensor chip, the terminals extending only on the chip-mounting surface, the terminals being held entirely in contact with the chip-mounting surface, the terminals being exposed to an exterior of the image sensor module on the chip-mounting surface for ensuring direct external connection;
    said end of the connector portion being smaller in thickness than other portions of substrate.

2. The image sensor module according to claim 1, wherein the plurality of terminals are aligned along an edge of said end at a predetermined pitch.

3. The image sensor module according to claim 1, wherein the chip-mounting surface is provided with a wiring pattern including the plurality of terminals, the reverse surface being stepped for making said end of the connector portion smaller in thickness than other portions of the substrate.

4. The image sensor module according to claim 1, wherein the frame supports a lens for forming an image of an object on the image sensor chip.

5. The image sensor module according to claim 4, further comprising an optical filter for blocking light of a predetermined wavelength range of light traveling toward the image sensor chip.

6. A method of making an image sensor module comprising the steps of:
    preparing an aggregate board including a terminal-forming surface formed with plural sets of terminals in a manner such that the plural sets of terminals are held entirely in contact with the terminal-forming surface;
    mounting a plurality of image sensor chips on the terminal-forming surface;
    mounting a plurality of frames on the aggregate board so that each frame surrounds a respective one of the image sensor chips while avoiding the terminals, the terminals being exposed to an exterior of the frames on the terminal-forming surface for ensuring direct external connection; and
    dividing the aggregate board into a plurality of substrates so that each frame and the relevant set of terminals are located on a same substrate, each substrate being a single-layer member made of a single kind of material as a whole;

wherein the method further comprises the step of partially reducing a thickness of the aggregate board so that each substrate resulting from the aggregate board includes an end portion that is smaller in thickness than other portions of said each substrate.

7. The method of making an image sensor module according to claim 6, further comprising the step of mounting an image forming lens to each of the frames after the step of mounting the plurality of frames on the aggregate board and before or after the step of dividing the aggregate board into the plurality of substrates.

* * * * *